US011373924B2

(12) United States Patent
Park et al.

(10) Patent No.: US 11,373,924 B2
(45) Date of Patent: Jun. 28, 2022

(54) POWER MODULE HAVING HEAT DISSIPATION STRUCTURE

(71) Applicants: HYUNDAI MOTOR COMPANY, Seoul (KR); KIA MOTORS CORPORATION, Seoul (KR)

(72) Inventors: Jun Hee Park, Hwaseong-si (KR); Hyun Koo Lee, Goyang-si (KR)

(73) Assignees: HYUNDAI MOTOR COMPANY, Seoul (KR); KIA MOTORS CORPORATION, Seoul (KR)

( * ) Notice: Subject to any disclaimer, the term of this patent is extended or adjusted under 35 U.S.C. 154(b) by 175 days.

(21) Appl. No.: 16/200,501

(22) Filed: Nov. 26, 2018

(65) Prior Publication Data
US 2020/0111721 A1 Apr. 9, 2020

(30) Foreign Application Priority Data
Oct. 4, 2018 (KR) .................. 10-2018-0118044

(51) Int. Cl.
*H01L 23/373* (2006.01)
*H01L 23/367* (2006.01)
*H01L 23/498* (2006.01)
*H01L 23/495* (2006.01)
*H01L 25/07* (2006.01)
*H05K 7/20* (2006.01)
*H05K 1/02* (2006.01)
(Continued)

(52) U.S. Cl.
CPC ........ *H01L 23/3735* (2013.01); *H01L 23/367* (2013.01); *H01L 23/49568* (2013.01); *H01L 23/49844* (2013.01); *H01L 23/49894* (2013.01); *H01L 24/33* (2013.01); *H01L 24/83* (2013.01); *H01L 25/072* (2013.01); *H01L 25/18* (2013.01); *H05K 1/0204* (2013.01); *H05K 7/20409* (2013.01); *H01L 2224/33* (2013.01); *H01L 2224/83801* (2013.01)

(58) Field of Classification Search
CPC .............. H01L 23/3735; H01L 23/367; H01L 23/49568; H01L 23/49844; H01L 23/49894; H01L 24/33; H01L 24/83; H01L 25/072; H01L 25/18; H01L 2224/33; H01L 2224/83801; H05K 1/0204; H05K 7/20409
USPC ........................................................ 257/712
See application file for complete search history.

(56) References Cited

U.S. PATENT DOCUMENTS 6,975,512 B1 12/2005 Ooi
10,147,665 B2 * 12/2018 Park .................... H01L 25/072
2009/0116197 A1 5/2009 Funakoshi et al.
(Continued)

FOREIGN PATENT DOCUMENTS

JP 2008-060531 A 3/2008
JP 2010-258315 A 11/2010
(Continued)

OTHER PUBLICATIONS

Notice of Allowance issued in Korean Application No. 10-2016-0171215 dated Jan. 18, 2019.

*Primary Examiner* — Xia L Cross
(74) *Attorney, Agent, or Firm* — Morgan, Lewis & Bockius LLP

(57) ABSTRACT

Disclosed is a power module capable of maximizing heat dissipation performance through application of a thick lead frame and a ceramic coating layer to upper and lower sides of a semiconductor device.

12 Claims, 4 Drawing Sheets

100(100a,100b)
200(200a,200b,200c,200d)
400(400a,400b)
600(600a,600b)

(51) Int. Cl.
    *H01L 23/00*     (2006.01)
    *H01L 25/18*     (2006.01)

(56) References Cited

U.S. PATENT DOCUMENTS

| | | | |
|---|---|---|---|
| 2014/0185243 A1* | 7/2014 | Joo | H01L 23/4334 |
| | | | 361/709 |
| 2015/0049442 A1 | 2/2015 | Tani et al. | |
| 2016/0005676 A1* | 1/2016 | Orimoto | H01L 23/3675 |
| | | | 257/714 |
| 2016/0126157 A1* | 5/2016 | Jeon | H01L 23/043 |
| | | | 257/693 |
| 2016/0163618 A1 | 6/2016 | Tani et al. | |
| 2016/0358840 A1* | 12/2016 | Aono | H01L 23/49877 |
| 2017/0216948 A1* | 8/2017 | Park | B23K 3/085 |
| 2017/0278774 A1 | 9/2017 | Hayashi et al. | |
| 2017/0366073 A1* | 12/2017 | Hieda | H02M 7/003 |
| 2018/0102301 A1 | 4/2018 | Jeon et al. | |
| 2018/0174945 A1 | 6/2018 | Park et al. | |
| 2018/0211938 A1 | 7/2018 | Tsuyuno et al. | |
| 2019/0103340 A1* | 4/2019 | Tsuchimochi | H01L 23/3121 |

FOREIGN PATENT DOCUMENTS

| | | | |
|---|---|---|---|
| KR | 10-2015-0119302 A | 10/2015 | |
| KR | 10-2016-0050282 A | 11/2016 | |
| WO | 2012/120594 A1 | 9/2012 | |

\* cited by examiner

POWER MODULE HAVING HEAT DISSIPATION STRUCTURE

CROSS REFERENCE TO RELATED APPLICATION

The present application is based on and claims the benefit of priority to Korean Patent Application No. 10-2018-0118044, filed on Oct. 4, 2018 with the Korean Intellectual Property Office, the entire contents of which is incorporated herein for all purposes by this reference.

TECHNICAL FIELD

The present disclosure relates generally to a power module and, more particularly, to a power module capable of maximizing heat dissipation performance through application of a thick lead frame and a ceramic coating layer to upper and lower sides of a semiconductor device.

BACKGROUND

As well known in the art, a power converter (for example, an inverter), which is one of the core components of hybrid vehicles and electric vehicles, is being developed as a major component of environmentally friendly vehicles. A power module, which is a core component of the power converter and is most costly, is being developed as key technology in the field of environmentally friendly vehicles.

A power module according to the related art typically uses a substrate having a circuit formed by bonding metal to ceramic, which is called a direct bonded copper (DBC) substrate or an active metal bonded (AMB) substrate, for implementing electrical insulation. Such a DBC substrate is characterized in that heat generated from a semiconductor device is transferred to a copper layer while diffusing both in a height direction and a width direction of the substrate. In particular, heat diffuses through a material having high thermal conductivity such as the substrate at an angle of approximately 45 degrees and diffuses through a material having low thermal conductivity such as an insulation layer at an angle close to a right angle. Accordingly, in order to increase a heat dissipation area to increase cooling efficiency, it is necessary to increase the thickness of the copper layer to define a space allowing heat to diffuse in the width direction of the substrate.

However, in the case of the DBC substrate according to the related art, ceramic and metal are bonded together through a eutectic reaction at a temperature of equal to or greater than 1065° C. Because of this, a high internal residual stress is accumulated after cooling due to difference in thermal expansion coefficient between ceramic and metal, resulting in interfacial delamination occurring during temperature cycle testing (TCT) and which accelerates as the thickness of the metal layer increases. As a result, it is difficult to apply thin ceramic and thick metal (a metal layer having a thickness of equal to or greater than 0.3 t may cause a problem in reliability, and a metal layer having a thickness of equal to or greater than 0.5 t is difficult to manufacture).

To solve such disadvantages of the DBC substrate, there has been proposed a power module configured such that a ceramic substrate and a copper layer are arranged to be in contact with each other with a heat transfer material interposed therebetween for electrical insulation of the copper layer without increasing the thickness of the copper layer constituting a lead frame and without using the DBC substrate. Such a power module using the ceramic substrate is advantageous over a technology using the DBC substrate having the copper layer increased in thickness in terms of heat dissipation performance. However, there is a limit to an improvement of heat dissipation performance due to the heat transfer material interposed between the ceramic substrate and the copper layer. Additionally, it is difficult to realize uniform application of the heat transfer material required for achieving an improvement of heat dissipation performance, and there is a limit in realizing a thin ceramic substrate.

Accordingly, there is a need to develop a technique capable of improving heat dissipation performance by increasing the thickness of the metal layer while preventing ceramic fracture from occurring.

The foregoing is intended merely to aid in the understanding of the background of the present disclosure, and is not intended to mean that the present disclosure falls within the purview of the related art that is already known to those skilled in the art.

SUMMARY

Accordingly, the present disclosure has been made keeping in mind the above problems occurring in the related art, and an objective of the present disclosure is to provide a power module capable of maximizing heat dissipation performance through application of a thick lead frame and a ceramic coating layer to upper and lower sides of a semiconductor device.

In order to achieve the above objective, according to one aspect of the present disclosure, there is provided a power module, including: an upper substrate and a lower substrate that are made of a metal material; a semiconductor device positioned between a lower surface of the upper substrate and an upper surface of the lower substrate and establishing an electrical connection therewith; and a coating layer bonded to each of an upper surface of the upper substrate and a lower surface of the lower substrate.

The coating layer may be made of a ceramic material.

Each of the upper substrate and the lower substrate may be greater in thickness than the coating layer.

The power module may further include a metal spacer positioned between the lower surface of the upper substrate and an upper surface of the semiconductor device.

The power module may further include a metal spacer positioned between the lower surface of the upper substrate and an upper surface of the semiconductor device and between the lower surface of the upper substrate and the upper surface of the lower substrate.

The coating layers bonded to the upper and lower substrates may be configured such that opposed surfaces thereof are bonded to the upper surface of the upper substrate and the lower surface of the lower substrate, respectively, while opposite surfaces thereof are bonded to respective cooling means.

The coating layer may have a thickness of equal to or less than 0.3 mm.

Either of the upper substrate and the lower substrate may have a thickness at least five times a thickness of the coating layer.

According to another aspect of the present disclosure, there is provided a power module, including: an upper substrate and a lower substrate that are made of a metal material; a semiconductor device positioned between a lower surface of the upper substrate and an upper surface of the lower substrate and establishing an electrical connection therewith; a first coating layer bonded to an upper surface of the upper substrate; a second coating layer bonded to a lower surface of the lower substrate; and a metal spacer positioned between the lower surface of the upper substrate and an upper surface of the semiconductor device.

The first and second coating layers may be made of a ceramic material.

The upper substrate and the lower substrate may be greater in thickness than the first coating layer and the second coating layer.

The spacer may be positioned between the lower surface of the upper substrate and the upper surface of the semiconductor device and between the lower surface of the upper substrate and the upper surface of the lower substrate.

The first coating layer may be configured such that a first surface thereof is bonded to the upper surface of the upper substrate while a second surface thereof is bonded to a cooling means, and the second coating layer may be configured such that a first surface thereof is bonded to the lower surface of the lower substrate while a second surface thereof is bonded to a cooling means.

Each of the first and second coating layers may have a thickness of equal to or less than 0.3 mm.

The upper substrate may have a thickness at least five times a thickness of the first coating layer, and the lower substrate may have a thickness at least five times a thickness of the second coating layer.

According to the power module according to the present disclosure, it is possible to maximize heat dissipation performance through application of the thick lead frame and the ceramic coating layer to the upper and lower sides of the semiconductor device.

Furthermore, it is possible to form a thin ceramic coating layer after EMC molding, leading to formation of insulation and thus improving heat dissipation efficiency.

Furthermore, application of ceramic coating makes it possible to perform coating regardless of warpage, slight surface roughness, and the like of an EMC-molded body and thus makes it unnecessary to require additional EMC processing.

Furthermore, the ceramic insulation layer is structured to be bonded to the power module and thus the possibility of ceramic fracture is low due to the inherent characteristics of ceramic having high compressive strength.

Furthermore, application of the thick lead frame and the ceramic coating layer to the upper and lower sides of the semiconductor device makes it possible to minimize occurrence of internal stress due to the difference in CTE, which may occur due to the structure of the power module having a DBC substrate being applied, and makes it possible to achieve improved high-temperature reliability.

BRIEF DESCRIPTION OF THE DRAWINGS

The above and other objects, features and other advantages of the present disclosure will be more clearly understood from the following detailed description when taken in conjunction with the accompanying drawings, in which.

DETAILED DESCRIPTION

Figure 1:
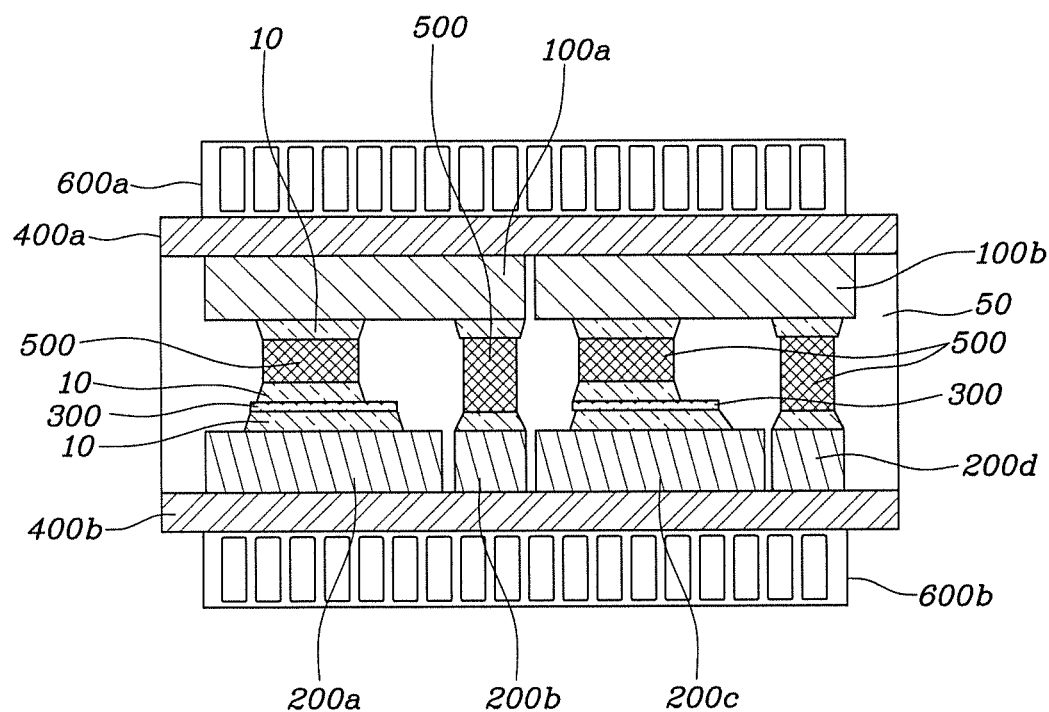
FIG. 1 a view showing a structure of a power module according to exemplary embodiments of the present disclosure.

Hereinbelow, a power module according to exemplary embodiments of the present disclosure will be described in detail with reference to the accompanying drawings. Throughout the drawings, the same reference numerals will refer to the same or like parts.

Figure 2:
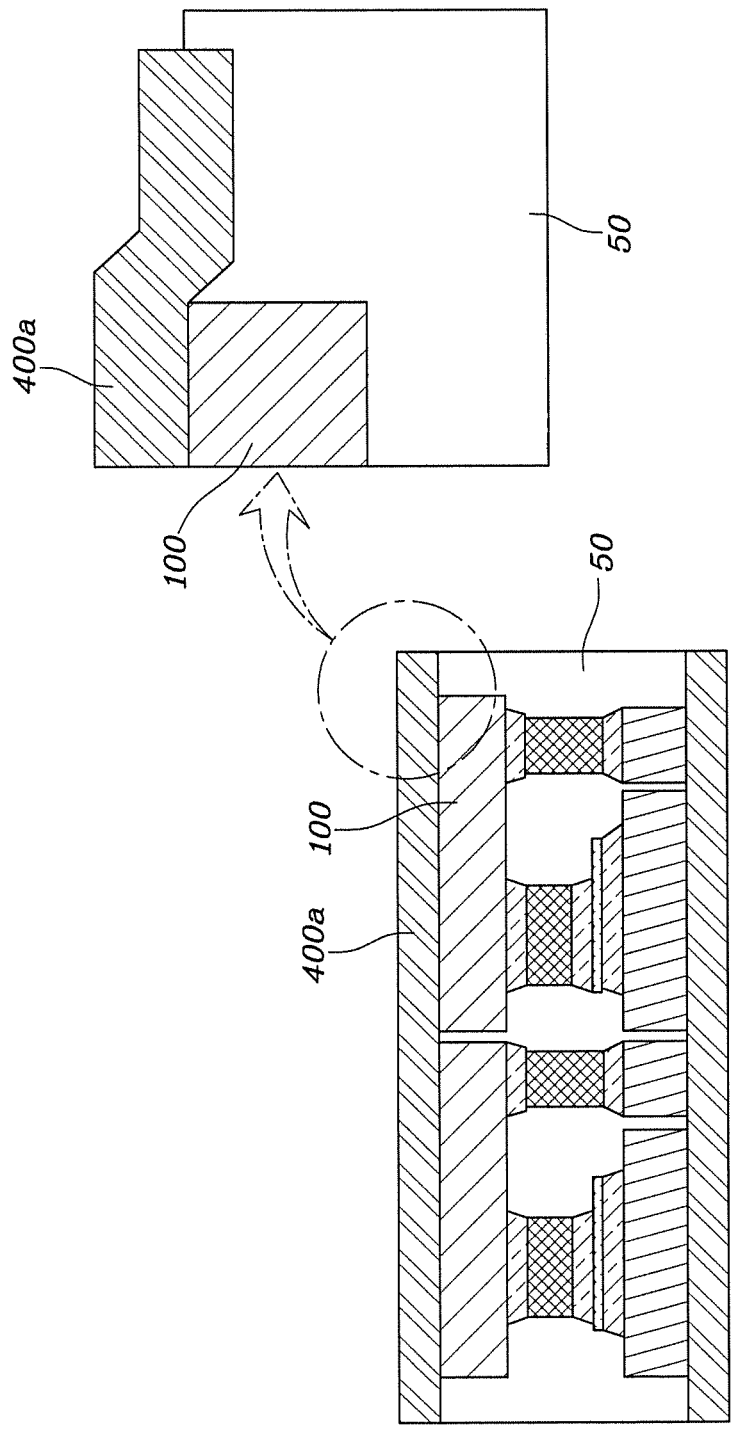
FIGS. 2 to 4 are views showing a process of forming a coating layer of the power module according to the exemplary embodiments of the present disclosure.
Figure 3:
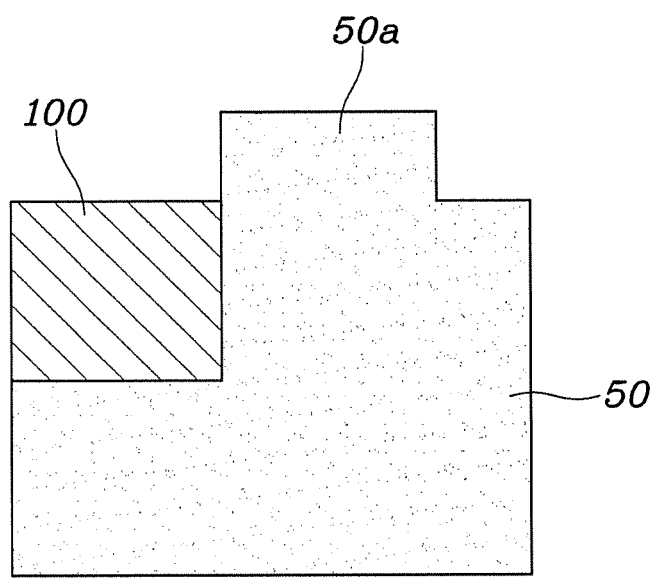
Figure 4:
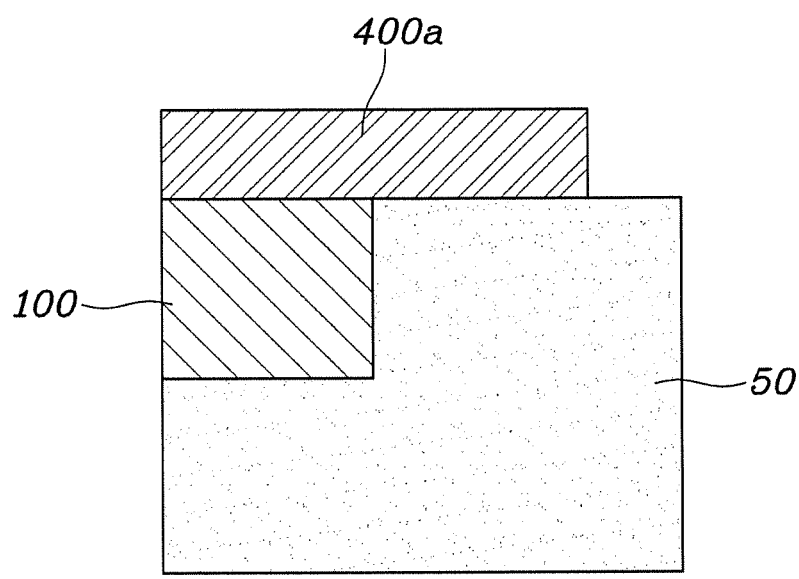

FIG. 1 a view showing a structure of a power module according to the exemplary embodiments of the present disclosure, and FIGS. 2 to 4 are views showing a process of forming a coating layer of the power module according to the exemplary embodiments of the present disclosure.

A power module according to a first embodiment of the present disclosure may include: an upper substrate 100 and a lower substrate 200 that are made of a metal material; a semiconductor device 300 positioned between a lower surface of the upper substrate 100 and an upper surface of the lower substrate 200 and establishing an electrical connection therewith; and a coating layer 400 (400a and 400b) bonded to each of an upper surface of the upper substrate 100 and a lower surface of the lower substrate 200.

The upper substrate 100 may be made of a metal material, and the metal material may be a Cu material. As shown in the drawings, the upper substrate 100 is formed in an island shape. Upper substrates 100a and 100b serve as output terminals and are connected to a driving motor to supply power.

The lower substrate 200 may be made of a metal material, and the metal material may be a Cu material. As shown in the drawings, the lower substrate 200 is formed in an island shape. A lower substrate 200a serves as a positive terminal (+) and is connected to a positive terminal (+) of a battery while a lower substrate 200d serves as a negative terminal (−) and is connected to a negative terminal (−) of the battery such that the lower substrates 200a and 200d receive power. A lower substrate 200c serves as an output terminal and is connected to the driving motor to supply power.

As an example of the present disclosure, each of the upper substrate 100 and the lower substrate 200 may have a thickness of 0.6 t (mm), which is thicker than a thickness (0.1 to 0.2 t (mm)) of the coating layer 400. The thick upper and lower substrates 100 and 200 ensure an increased heat dissipation area, making it possible to maximize heat dissipation performance (the trapezoidal shapes of the upper substrate 100 and the lower substrate 200 shown in the drawings indicate directions in which heat of the semiconductor device 300 diffuses through the copper substrates at an angle of 45°).

The semiconductor device 300 is positioned between a lower surface of the upper substrate 100 and an upper surface of the lower substrate 200 to establish the electrical connection therewith. Specifically explained, as shown in the drawings, two semiconductor devices 300 may be arranged between the lower surface of the upper substrate 100 and the upper surface of the lower substrate 200.

The power module may further include a copper spacer 500 positioned between the lower surface of the upper substrate 100 and an upper surface of the semiconductor device 300 and between the lower surface of the upper substrate 100 and the upper surface of the lower substrate 200. The spacers 500 serve to transmit heat and electricity.

A solder layer 10 is provided between the upper substrate 100, the spacer 500, the semiconductor device 300, and the lower substrate 200, and between the upper substrate 100, the spacer 500, and the lower substrate 200 such that the substrates, the spacers, and the semiconductor devices are bonded to each other by respective solder layers.

Epoxy molding compound (EMC) is employed as a filler.

The coating layer 400 is bonded to each of the upper surface of the upper substrate 100 and the lower surface of the lower substrate 200.

In the exemplary embodiments of the present disclosure, bonding of the coating layer 400 may be realized by performing EMC molding and then forming on each of the upper surface of the upper substrate 100 and the lower surface of the lower substrate 200 a ceramic coating layer 400 having a thickness of equal to or less than 0.3 t (mm) (0.1 to 0.2 t (mm)) by using a known ceramic coating technique.

Referring to FIG. 2, ceramic coating is typically performed in a high-temperature process. Because of this, when a coating is famed on the surface of the EMC-molded upper substrate 100, an EMC-molded body 50 is melted, causing the coating to be formed lower than the metal upper substrate 100. To solve such a problem, as shown in FIG. 3, the EMC-molded body 50 is formed such that a stepped portion 50a is formed at a ceramic coating portion upon EMC molding, making it possible to form a flat ceramic coating.

Various ceramic materials can be applied as the material of the coating layer 400 through ceramic coating. As an example of the present disclosure, applicable ceramic materials include low-priced $Al_2O_3$, high-priced high-performance ALN, $Si_3N_4$, and the like.

The application of the ceramic coating layer 400 makes it possible to apply a relatively thick lead frame such as the upper substrate 100 and the lower substrate 200, thus achieving an increase in heat dissipation area.

Furthermore, one layer of thermal grease of a conventional DBC substrate is removed, thus improving heat dissipation performance.

Furthermore, the application of the ceramic coating layer 400 makes it possible to form a thin ceramic layer, which is an insulating layer, and the thickness thereof is variable depending on an operating voltage.

Furthermore, the application of the ceramic coating layer 400 makes it possible to perform ceramic coating regardless of warpage, slight surface roughness, and the like of the EMC-molded body and thus makes it unnecessary to require additional EMC processing.

Furthermore, the ceramic coating layer 400 is structured to be bonded to the power module and thus the possibility of ceramic fracture is low due to the inherent characteristics of ceramic having high compressive strength.

The coating layers 400 bonded to the upper or lower substrate 100 or 200 are configured such that opposed surfaces thereof are bonded to the upper surface of the upper substrate 100 or the lower surface of the lower substrate 200, respectively, while opposite surfaces thereof are bonded to respective cooling means 600. On the other hand, a power module according to a second embodiment of the present disclosure may include: an upper substrate 100 and a lower substrate 200 that are made of a metal material; a semiconductor device 300 positioned between a lower surface of the upper substrate 100 and an upper surface of the lower substrate 200 and establishing an electrical connection therewith; a first coating layer 400a bonded to an upper surface of the upper substrate 100; a second coating layer 400b bonded to a lower surface of the lower substrate 200; and a metal spacer 500 positioned between the lower surface of the upper substrate 100 and an upper surface of the semiconductor device 300.

The first and second coating layers 400a and 400b may be made of a ceramic material. The upper substrate 100 and the lower substrate 200 may be greater in thickness than the first coating layer 400a and the second coating layer 400b. The first coating layer 400a may be configured such that a first surface thereof is bonded to the upper surface of the upper substrate 100 while a second surface thereof is bonded to a first cooling means 600a. The second coating layer 400b may be configured such that a first surface thereof is bonded to the lower surface of the lower substrate 200 while a second surface thereof is bonded to a second cooling means 600b. The materials of the first and second coating layers 400a and 400b and the thicknesses of the upper substrate 100 and the lower substrate 200 remain the same as those of the power module according to the first embodiment of the present disclosure described above, so a detailed description thereof will be omitted herein.

In a manufacturing process of the power module according to the exemplary embodiments of the present disclosure, there has been described a technique of forming the stepped portion of the EMC-molded body to apply ceramic coating after EMC molding. As another manufacturing process, a power module may be manufactured such that ceramic coating is firstly performed on the upper surface of the upper substrate 100 and the lower surface of the lower substrate 200 in a lead frame state, and a soldering process is secondly performed in the same manner as a typical ceramic substrate (DBC substrate), and lastly EMC molding is performed. This technique is characterized in that ceramic coating is performed in the lead frame state prior to EMC molding. This makes it possible to apply a thick metal substrate (for example, a metal substrate of Cu material having a thickness of equal to or greater than 1.6 t), which is structurally stable and efficient in heat dissipation of the power module.

Table 1 below shows a comparison between the thermal resistance of a conventional power module in the case of applying a thermal interface material (TIM) rather than applying a ceramic coating, and the thermal conductivity in the case of applying ceramic coatings of $Al_2O_3$ and $Y_2O_3$.

TABLE 1

|  | Thickness | Thermal Resistance (° C./W) |
| --- | --- | --- |
| TIM applied (SiN + Tim layer) | 0.3T (SiN) | 0.18 |
| $Al_2O_3$ coating | 200 ± 30 μm | 0.183 |
| $Y_2O_3$ coating | 150 ± 30 μm | 0.154 |

As shown in Table 1, the thermal resistance in the case of forming a ceramic coating layer can be at least equal to or less than that in the case of applying conventional ceramic substrate and TIM.

Table 2 below shows the thermal resistance according to a change in thickness of the ceramic coating layer and the thickness of a copper layer.

TABLE 2

| Ceramic Coating Layer Thickness (mm) | Copper Layer Thickness (mm) | Thermal Resistance (° C./W) |
| --- | --- | --- |
| 0.2 | 0.3 | 0.188 |
|  | 0.5 | 0.179 |
|  | 0.8 | 0.166 |
|  | 1 | 0.159 |
|  | 1.2 | 0.152 |
|  | 1.5 | 0.143 |
|  | 1.8 | 0.134 |
| 0.3 | 0.3 | 0.206 |
|  | 0.5 | 0.195 |
|  | 0.8 | 0.181 |
|  | 1 | 0.173 |
|  | 1.2 | 0.165 |
|  | 1.5 | 0.155 |
|  | 1.8 | 0.146 |

Considering that the thermal resistance is 0.159° C./W when the copper layer thickness of the conventional power module applying the ceramic substrate and TIM is set to 1.8 mm, when the thickness of the ceramic coating layer is 0.2 mm, if the thickness of the copper layer is equal to or greater than 1 mm, it is possible to secure heat transfer performance equal to or better than that of the conventional power module applying the ceramic substrate and TIM. Furthermore, when the thickness of the ceramic coating layer is 0.3 mm, if the thickness of the copper layer is equal to or greater than 1.5 mm, it is possible to secure heat transfer performance equal to or better than that of the conventional power module applying the ceramic substrate and TIM.

Considering this point, in the exemplary embodiments of the present disclosure, it can be confirmed that it is appropriate to secure the thickness of the copper layer at least five times the thickness of the ceramic coating layer in order to maintain excellent thermal resistance properties. It is preferable that the thickness of the ceramic coating layer is as thin as possible within a range allowed by the process for forming the ceramic coating layer. Considering that it is difficult for the conventional ceramic substrate to be formed to have a thickness of equal to or less than 0.3 mm due to process limitations, it is preferable that the thickness of the ceramic coating layer is equal to or less than 0.3 mm.

As described above, the power module according to the exemplary embodiments of the present disclosure can be advantageous over the conventional power module applying the ceramic substrate and TIM in that more excellent heat dissipation performance is secured while achieving various effects according to application of ceramic coating.

For example, in the power module according to the exemplary embodiments of the present disclosure, the application of the ceramic coating layer leads to the application of the thick lead frame to upper and lower sides of the semiconductor device, making it possible to maximize heat dissipation performance.

Furthermore, in the power module according to the exemplary embodiments of the present disclosure, it is possible to form a thin ceramic coating layer after EMC molding, leading to formation of insulation and thus improving heat dissipation efficiency.

Furthermore, in the power module according to the exemplary embodiments of the present disclosure, application of ceramic coating makes it possible to perform coating regardless of warpage, slight surface roughness, and the like of the EMC-molded body and thus makes it unnecessary to require additional EMC processing.

Furthermore, in the power module according to the exemplary embodiments of the present disclosure, the ceramic insulation layer is structured to be bonded to the power module and thus the possibility of ceramic fracture is low due to the inherent characteristics of ceramic having high compressive strength.

Although a preferred embodiment of the present disclosure has been described for illustrative purposes, those skilled in the art will appreciate that various modifications, additions and substitutions are possible, without departing from the scope and spirit of the invention as disclosed in the accompanying claims.

What is claimed is:

1. A power module, comprising:
an upper substrate and a lower substrate that are made of a metal material, each of the upper and lower substrates having separate parts spaced apart from each other, wherein at least one of the separate parts of each of the upper and lower substrates is connected to a driving motor to supply power, wherein the separate parts of the lower substrate comprise first and second lower substrates spaced apart from each other, wherein the separate parts of the upper substrate comprise first and second upper substrates spaced apart from each other;
a semiconductor device disposed between a lower surface of the first upper substrate and an upper surface of the first lower substrate and establishing an electrical connection therewith;
at least one coating layer bonded to at least one of an upper surface of the upper substrate or a lower surface of the lower substrate;
a cooling means bonded to the at least one coating layer;
a first metal spacer disposed between the lower surface of the first upper substrate and an upper surface of the semiconductor device;
a second metal spacer disposed between the lower surface of the first upper substrate and an upper surface of the second lower substrate;
solder layers respectively disposed between the first upper substrate, the first metal spacer, the semiconductor device, and the first lower substrate and respectively between the first upper substrate, the second metal spacer, and the second lower substrate, such that the upper and lower substrates, the first and second metal spacers, and the semiconductor device are bonded to one another by the respective solder layers; and
a body at least partially enclosing the upper and lower substrates, the first and second metal spacers, and the semiconductor device,
wherein a portion of the body is disposed between the separate parts of the upper substrate and between the separate parts of the lower substrate,
wherein the first upper substrate is electrically connected to the first and second lower substrates via the first and second metal spacers, respectively,
wherein the separate parts of the lower substrate further comprise third and fourth lower substrates spaced apart from each other,
wherein the first upper substrate is a single continuous layer and completely covers the first and second lower substrates in a plan view, and the second upper substrate is a single continuous layer and completely covers the third and fourth lower substrates in the plan view, and
wherein a topmost surface of the body is below a topmost surface of the at least one coating layer, and the at least one coating layer is made of a ceramic material.

2. The power module of claim 1, wherein a thickness of each of the upper substrate and the lower substrate is greater than a thickness of the at least one coating layer.

3. The power module of claim 1, wherein the at least one coating layer bonded to the upper or lower substrate has one surface bonded to the upper surface of the upper substrate or the lower surface of the lower substrate, while another surface of the at least one coating layer opposite to the one surface is bonded to the cooling means.

4. The power module of claim 1, wherein the at least one coating layer has a thickness equal to or less than 0.3 mm.

5. The power module of claim 1, wherein either of the upper substrate and the lower substrate has a thickness at least five times a thickness of the at least one coating layer.

6. The power module of claim 1, wherein the body includes an epoxy molding compound.

7. A power module, comprising:
an upper substrate and a lower substrate that are made of a metal material, each of the upper and lower substrates having separate parts spaced apart from each other, wherein at least one of the separate parts of each of the upper and lower substrates is connected to a driving motor to supply power, wherein the separate parts of the lower substrate comprise first and second lower substrates spaced apart from each other, wherein the separate parts of the upper substrate comprise first and second upper substrates spaced apart from each other;

a semiconductor device disposed between a lower surface of the first upper substrate and an upper surface of the first lower substrate and establishing an electrical connection therewith;

a first coating layer bonded to an upper surface of the upper substrate;

a second coating layer bonded to a lower surface of the lower substrate;

a first cooling means bonded to the first coating layer;

a second cooling means bonded to the second coating layer;

a first metal spacer disposed between the lower surface of the first upper substrate and an upper surface of the semiconductor device;

a second metal spacer disposed between the lower surface of the first upper substrate and an upper surface of the second lower substrate;

solder layers respectively disposed between the first upper substrate, the first metal spacer, the semiconductor device, and the first lower substrate and respectively between the first upper substrate, the second metal spacer, and the second lower substrate, such that the upper and lower substrates, the first and second metal spacers, and the semiconductor device are bonded to one another by the respective solder layers; and a body at least partially enclosing the upper and lower substrates, the metal spacers, and the semiconductor device, wherein a portion of the body is disposed between the separate parts of the upper substrate and between the separate parts of the lower substrate, wherein the first upper substrate is electrically connected to the first and second lower substrates via the first and second metal spacers, respectively, wherein the separate parts of the lower substrate further comprise third and fourth lower substrates spaced apart from each other, wherein the first upper substrate is a single continuous layer and completely covers the first and second lower substrates in a plan view, and the second upper substrate is a single continuous layer and completely covers the third and fourth lower substrates in the plan view, and wherein a topmost surface of the body is below a topmost surface of the first and second coating layers, and the first and second coating layers are made of a ceramic material.

8. The power module of claim 7, wherein each thickness of the upper substrate and the lower substrate is greater than each thickness of the first coating layer and the second coating layer.

9. The power module of claim 7, wherein the first coating layer includes a first surface bonded to the upper surface of the upper substrate and a second surface bonded to the first cooling means, and the second coating layer includes a first surface bonded to the lower surface of the lower substrate and a second surface bonded to a second cooling means.

10. The power module of claim 7, wherein each of the first and second coating layers has a thickness equal to or less than 0.3 mm.

11. The power module of claim 7, wherein the upper substrate has a thickness at least five times a thickness of the first coating layer, and the lower substrate has a thickness at least five times a thickness of the second coating layer.

12. The power module of claim 7, wherein the body includes an epoxy molding compound.

* * * * *